US006822903B2

(12) United States Patent
Scheuerlein et al.

(10) Patent No.: US 6,822,903 B2
(45) Date of Patent: Nov. 23, 2004

(54) APPARATUS AND METHOD FOR DISTURB-FREE PROGRAMMING OF PASSIVE ELEMENT MEMORY CELLS

(75) Inventors: Roy E. Scheuerlein, Cupertino, CA (US); N. Johan Knall, Sunnyvale, CA (US)

(73) Assignee: Matrix Semiconductor, Inc., Santa Clara, CA (US)

(*) Notice: Subject to any disclaimer, the term of this patent is extended or adjusted under 35 U.S.C. 154(b) by 0 days.

(21) Appl. No.: 10/403,488

(22) Filed: Mar. 31, 2003

(65) Prior Publication Data

US 2004/0190359 A1 Sep. 30, 2004

(51) Int. Cl.[7] ............................................. G11C 11/34
(52) U.S. Cl. ............................... 365/185.18; 365/225.7
(58) Field of Search ......................... 365/185.18, 225.7

(56) References Cited

U.S. PATENT DOCUMENTS

| | | | |
|---|---|---|---|
| 4,543,594 A | 9/1985 | Mohsen et al. ............. | 257/530 |
| 4,602,354 A | 7/1986 | Craycraft et al. ........... | 365/104 |
| 4,646,266 A | 2/1987 | Ovshinsky et al. ......... | 365/105 |
| 4,868,616 A | 9/1989 | Johnson et al. ............. | 257/63 |
| 4,876,220 A | 10/1989 | Mohsen et al. ............. | 438/200 |
| 4,881,114 A | 11/1989 | Mohsen et al. ............. | 257/530 |
| 5,301,144 A | 4/1994 | Kohno ........................ | 365/185.11 |

(List continued on next page.)

OTHER PUBLICATIONS

Graaf DE C., et al., "A Novel High–Density Low–Cost Diode Programmable Read Only Memory," 1996 IEEE, IEDM Technical Digest, San Francisco, CA, Dec. 8–11, 1996, pp. 189–192.

Naji, Peter K., et al., "A 256kb 3.0V 1T1MTJ Nonvolatile Magnetoresistive RAM," 2001 IEEE ISSCC, Feb. 6, 2001, Paper 7.6, and associated slide handouts, 35 pages.

Greene, Jonathan, et al., "Antifuse Field Programmable Gate Arrays," Proceedings of the IEEE, vol. 81, No. 7, New York, Jul. 1993, pp. 1042–1056.

Takeuchi, Ken, et al., "A Negative $V_{th}$ Cell Architecture for Highly Scalable, Excellently Noise–Immune, and Highly Reliable NAND Flash Memories," IEEE Journal of Solid–State Circuits, vol. 34, No. 5, May, 1999, pp. 675–684.

Nishihara, Toshiyuki, et al., "A Quasi–Matrix Ferroelectric Memory for Future Silicon Storage," IEEE Journal of Solid–State Circuits, vol. 37, No. 11, Nov., 2002, pp. 1479–1484.

Sugibayashi, Tadahiko, et al., "A 30–ns 256–Mb DRAM with a Multidivided Array Structure," IEEE Journal of Solid–State Circuits, vol. 28, No. 11, Nov., 1993, pp. 1092–1098.

Evans, Robert J., et al., "Energy Consumption Modeling and Optimization for SRAM's," IEEE Journal of Solid–State Circuits, vol. 30, No. 5, May 1995, pp. 571–579.

*Primary Examiner*—M. Tran
(74) *Attorney, Agent, or Firm*—Zagorin, O'Brien & Graham, LLP

(57) ABSTRACT

In a passive element memory array, such as a rail stack array having a continuous semiconductor region along one or both of the array lines, programming a memory cell may disturb nearby memory cells as result of a leakage path along the array line from the selected cell to the adjacent cell. This effect may be reduced substantially by changing the relative timing of the programming pulses applied to the array lines for the selected memory cell, even if the voltages are unchanged. In an exemplary three-dimensional antifuse memory array, a positive-going programming pulse applied to the anode region of the memory cell preferably is timed to lie within the time that a more lightly-doped cathode region is pulsed low.

47 Claims, 5 Drawing Sheets

U.S. PATENT DOCUMENTS

| | | | |
|---|---|---|---|
| 5,429,968 A | 7/1995 | Koyama | 438/152 |
| 5,568,421 A | 10/1996 | Aritome | 365/185.47 |
| 5,621,683 A | 4/1997 | Young | 365/185.05 |
| 5,751,012 A | 5/1998 | Wolstenholme et al. | 257/5 |
| 5,835,396 A | 11/1998 | Zhang | 365/51 |
| 5,926,415 A | 7/1999 | Shin | 365/185.17 |
| 5,991,193 A | 11/1999 | Gallagher et al. | 365/171 |
| 6,005,270 A | 12/1999 | Noguchi | 257/315 |
| 6,034,882 A | 3/2000 | Johnson et al. | 365/103 |
| 6,055,180 A | 4/2000 | Gudesen et al. | 360/236.3 |
| 6,128,214 A | 10/2000 | Kuekes et al. | 365/151 |
| 6,130,835 A | 10/2000 | Scheuerlein | 365/171 |
| 6,163,048 A | 12/2000 | Hirose et al. | 257/315 |
| 6,185,121 B1 | 2/2001 | O'Neill | 365/94 |
| 6,185,122 B1 | 2/2001 | Johnson et al. | 365/103 |
| 6,324,093 B1 | 11/2001 | Perner et al. | 365/171 |
| 6,335,890 B1 | 1/2002 | Reohr et al. | 365/225.5 |
| 6,356,477 B1 | 3/2002 | Tran | 365/158 |
| 6,363,000 B2 | 3/2002 | Perner et al. | 365/66 |
| 6,420,215 B1 | 7/2002 | Knall et al. | 438/131 |
| 6,445,613 B1 | 9/2002 | Nagai | 365/158 |
| 6,462,979 B2 | 10/2002 | Schlösser et al. | 365/158 |
| 6,473,328 B1 | 10/2002 | Mercaldi | 365/130 |
| 6,477,077 B1 | 11/2002 | Okazawa | 365/145 |
| 6,490,194 B2 | 12/2002 | Hoenigschmid | 365/171 |
| 6,498,747 B1 | 12/2002 | Gogl et al. | 365/158 |
| 6,515,888 B2 | 2/2003 | Johnson et al. | 365/130 |
| 6,522,594 B1 | 2/2003 | Scheuerlein | 365/206 |
| 6,525,953 B1 | 2/2003 | Johnson | 365/63 |
| 6,545,898 B1 | 4/2003 | Scheuerlein | 365/94 |
| 6,567,287 B2 | 5/2003 | Scheuerlein | 365/51 |
| 6,584,006 B2 | 6/2003 | Viehmann | 365/97 |
| 6,611,453 B2 | 8/2003 | Ning | 365/171 |
| 6,618,295 B2 | 9/2003 | Scheuerlein | 365/189.09 |
| 6,631,085 B2 | 10/2003 | Scheuerlein et al. | 365/175 |
| 6,703,861 B2 * | 3/2004 | Ting | 326/41 |
| 6,704,224 B2 * | 3/2004 | Natori | 365/185.18 |
| 2002/0028541 A1 | 3/2002 | Lee et al. | |
| 2003/0128581 A1 | 7/2003 | Scheuerlein et al. | |
| 2004/0002184 A1 | 1/2004 | Cleeves | |
| 2004/0100852 A1 | 5/2004 | Klevelan et al. | |
| 2004/0119122 A1 | 6/2004 | Ilkbahar et al. | |
| 2004/0124415 A1 | 7/2004 | Walker et al. | |

* cited by examiner

APPARATUS AND METHOD FOR DISTURB-FREE PROGRAMMING OF PASSIVE ELEMENT MEMORY CELLS

CROSS-REFERENCE TO RELATED APPLICATION(S)

This application is related to co-pending U.S. application Ser. No. 10/403,752 by Roy E. Scheuerlein, et al, entitled "Three-Dimensional Memory Device Incorporating Segmented Bit Line Memory Array", filed on even date herewith, which application is hereby incorporated by reference in its entirety.

This application is related to co-pending U.S. application Ser. No. 10/403,844 by Roy E. Scheuerlein, et al, entitled "Word Line Arrangement Having Multi-Layer Word Line Segments for Three-Dimensional Memory Array", filed on even date herewith, which application is hereby incorporated by reference in its entirety.

FIELD OF THE INVENTION

This invention relates to high-density semiconductor memory arrays and, in preferred embodiments, the invention particularly relates to monolithic three-dimensional antifuse memory arrays utilizing rail stacks.

BACKGROUND

Recently there has been an interest in fabricating memories having memory cells disposed at numerous levels above a substrate. Each level includes a plurality of spaced-apart first lines extending in one direction, which lines are vertically separated from a plurality of parallel spaced-apart second lines in a second direction, for example, extending perpendicular to the first lines. Memory cells are disposed between the first lines and second lines at the intersections (or the projection thereof) of these lines.

Exemplary memory arrays are described, for example, in U.S. Pat. Nos. 5,835,396 and 6,034,882, which describe a pillar style of memory cell, each formed between an associated first array line and an associated second array line. Characteristic of such pillar style memory cells is the separation of the various structures forming each cell from similar structures forming adjacent cells.

Another way of fabricating three-dimensional memory arrays departs from the structures shown in these patents and uses "rail-stacks" to form the memory cells. A rail stack is formed by creating successive layers of material, which are then etched together to form an aligned stack of layers. A memory cell may be formed at the intersection of two such rail stacks. Fabricating a memory array using rail stacks frequently requires fewer mask layers (and processing steps) to implement the array.

Exemplary memory arrays utilizing rail stacks are described in U.S. patent application Ser. No. 09/560,626 by N. Johan Knall, filed Apr. 28, 2000, which application describes a memory employing antifuses where a diode is formed upon programming a particular bit. In this connection see, "*A Novel High-Density Low-Cost Diode Programmable Read Only Memory,*" by de Graaf, Woerlee, Hart, Lifka, de Vreede, Janssen, Sluijs and Paulzen, IEDM-96, beginning at page 189 and U.S. Pat. Nos. 4,876,220; 4,881,114 and 4,543,594.

SUMMARY

In a passive element memory array, such as a rail stack array having a continuous semiconductor region along one or both of the array lines, we have observed that the programming of a memory cell may cause the unintentional programming of an adjacent memory cell. This is believed to be caused by a leakage path through the continuous semiconductor region from the selected cell to the adjacent cell. In an exemplary antifuse rail stack array, for example, a lightly-doped n-type semiconductor region (i.e., n− region) is continuous along the array line connected to the cathode region of the memory cells. A leakage current through this n− region from a programmed antifuse memory cell to an adjacent unprogrammed memory cell can collapse the depletion region under the adjacent antifuse, causing voltage stress which can erroneously write the adjacent bit. Such an effect may be reduced or eliminated by forming memory cells using a pillar structure rather than a rail stack structure, but this increases processing steps and manufacturing cost.

We have discovered that this erroneous programming of adjacent memory cells may be reduced substantially by changing the relative timing of the programming pulses applied to the array lines for the selected memory cell, even if the voltages are unchanged. Using the above exemplary antifuse rail stack memory array, a positive-going programming pulse applied to the anode region of the memory cell preferably is timed to lie within the time that the more lightly-doped cathode region is low (by virtue of a negative-going programming pulse applied to the cathode). For example, in certain embodiments the array line associated with the anode region of the selected memory cell is preferably driven to its programming voltage after the array line associated with the cathode region of the selected memory cell has substantially reached its programming voltage, and the 'anode' array line is preferably driven back to its unselected voltage before the 'cathode' array line begins to be driven back to its unselected voltage.

In a broader method context, the invention provides a method for programming a memory array having at least one memory plane. The array includes memory cells coupled between an associated one of a respective plurality of array lines on each of two memory array layers, and includes memory cells having an anode region and a cathode region, one of the regions being configured to inject charge to the other region when forward biased. The method includes driving a first array line associated with the injecting region of a selected memory cell to a selected bias voltage for the first array line, and driving a second array line associated with the non-injecting region of the selected cell to a selected bias voltage for the second array line. The method includes then driving the first array line to an unselected bias voltage for the first array line, and driving the second array line to an unselected bias voltage for the second array line, wherein the first array line voltage transitions at least a first percentage toward its unselected bias voltage before the second array line transitions at most a second percentage toward its unselected bias voltage.

In some embodiments the memory array may be a three-dimensional array having at least three array line layers defining at least two memory planes. In some embodiments the memory array may include back-to-back memory cells, in which a given array line connects to either the anode or the cathode of memory cells in the memory planes above and below the array line. In other embodiments, the memory array may include serial chain memory cells, in which a given array line connects to one of the anode or the cathode of memory cells in the memory plane above the array line, and connects to the other of the anode or the cathode of memory cells in the memory plane below the array line.

The invention is useful for a variety of memory cells. In some embodiments the memory array may include antifuse memory cells. In certain other embodiments, the memory array may include fuse memory cells. In certain other embodiments, the memory array may include memory cells having a ferro-electric material (e.g., magneto-resistive (MRAM) memory cells). In certain other embodiments, the memory array may include memory cell including an organic layer.

In certain preferred embodiments the non-injecting region of a memory cell includes a lightly-doped semiconductor region formed along one of the array lines in a rail stack configuration, and the injecting region of a memory cell includes a more heavily doped semiconductor region. An antifuse layer may be formed between the injecting region and the non-injecting region.

The invention in several aspects is suitable for integrated circuits having a memory array, for memory cell and memory array structures, for methods for operating such integrated circuits and memory arrays, and for computer readable media encodings of such integrated circuits or memory arrays, all as described herein in greater detail and as set forth in the appended claims.

The foregoing is a summary and thus contains, by necessity, simplifications, generalizations and omissions of detail. Consequently, those skilled in the art will appreciate that the foregoing summary is illustrative only and that it is not intended to be in any way limiting of the invention. Other aspects, inventive features, and advantages of the present invention, as defined solely by the claims, may be apparent from the detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
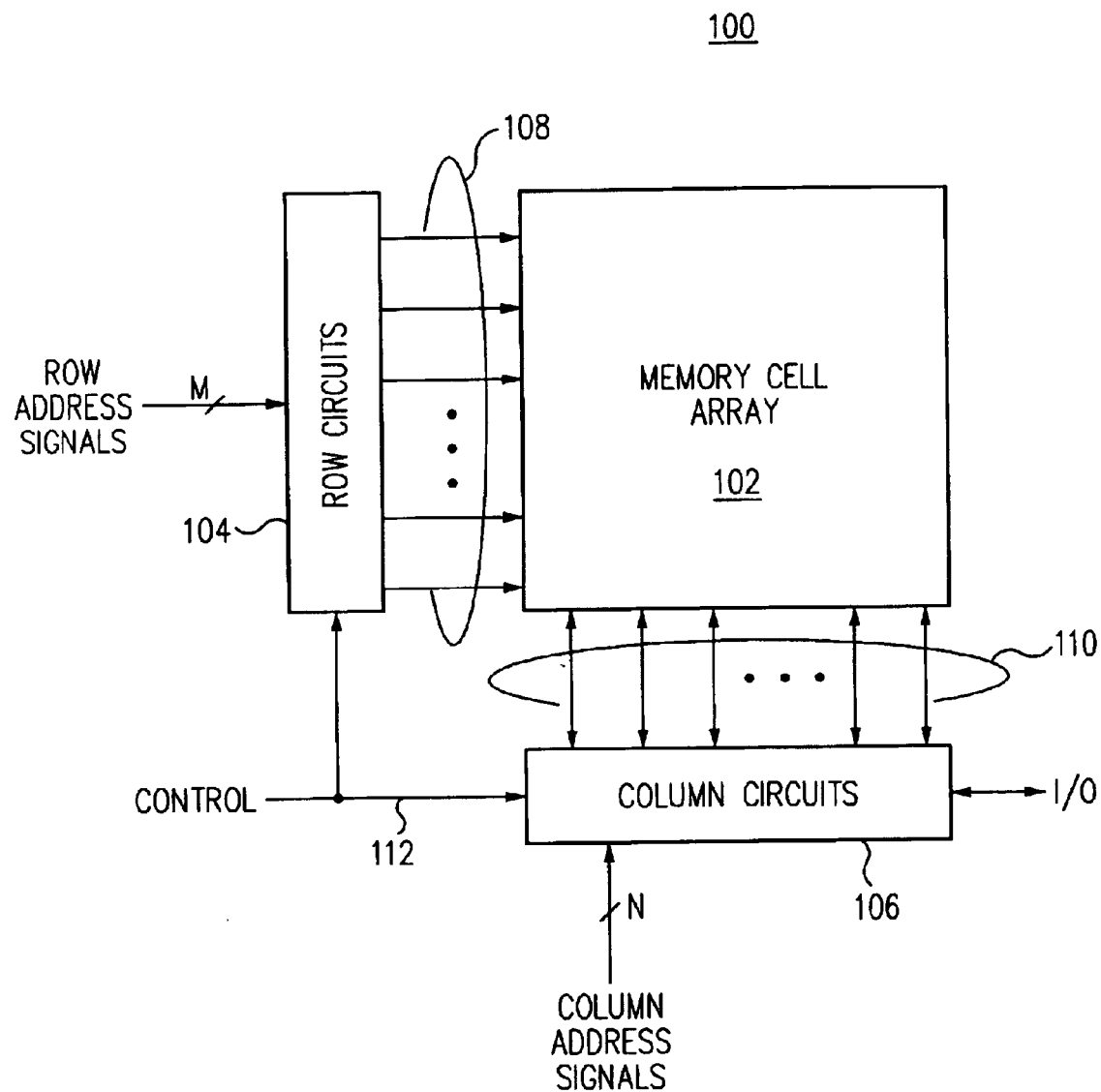
FIG. 1 is a simplified block diagram of an integrated circuit including a memory array.

Referring now to FIG. 1, a block diagram is shown of an integrated circuit 100 including a memory array 102, which diagram may be useful to represent various embodiments of the present invention. In one such embodiment, the memory array 102 is preferably a three-dimensional, field-programmable, non-volatile memory array having more than one level of memory cells. Exemplary three-dimensional memory arrays are disclosed in commonly-assigned U.S. patent application Ser. No. 09/560,626 referred to above, and in "Three-Dimensional Memory Array Incorporating Serial Chain Diode Stack" by Kleveland, et al, U.S. patent application Ser. No. 09/897,705, filed on Jun. 29, 2001, which is hereby incorporated by reference in its entirety.

In the presently described embodiment, array 102 is a three-dimensional, non-volatile, write-once memory array of passive element memory cells, although other memory arrays are also suitable. Each passive element memory cell within the memory array 102 is preferably a two-terminal memory cell having a steering element in series with a state change element, together connected between two usually orthogonal (but not necessarily so) array terminal lines, as described in the above-cited references. These two elements within a memory cell may both be present before programming. Alternatively, the steering element within a given memory cell may be formed during programming of the memory cell. Suitable state change elements include those having a significant change of resistance, including both fuses and antifuses. A memory cell whose state change element is an antifuse may be termed an antifuse memory cell, whereas a memory cell whose state change element is a fuse may be termed a fuse memory cell.

The array lines at one level may be termed word lines or X-lines. The array lines at a vertically adjacent level may be termed bit lines or Y-lines. A memory cell is formed at the projection of the intersection of each word line and each bit line, and is connected between the respective intersecting word line and bit line. A three-dimensional memory array which has at least two levels of memory cells may utilize at least more than one layer of word lines or more than one layer of bit lines. A group of word lines, each residing on a separate layer (i.e., level) and substantially vertically-aligned (notwithstanding small lateral offsets on some layers), may be collectively termed a row. The word lines within a row preferably share at least a portion of the row address. Similarly, a group of bit lines, each residing on a separate layer and substantially vertically-aligned (again, notwithstanding small lateral offsets on some layers), may be collectively termed a column. The bit lines within a column preferably share at least a portion of the column address.

The array terminals of memory array 102 include the various layer(s) of word lines organized as rows, and the various layer(s) of bit lines organized as columns. The integrated circuit 100 includes a row circuits block 104 whose outputs 108 are connected to respective word lines of the memory array 102. The row circuits block 104 receives a group of M row address signals, various control signals 112, and typically may include such circuits as row decoders and array terminal drivers for both read and write (i.e., programming) operations. The integrated circuit 100 also includes a column circuits block 106 whose input/outputs 110 are connected to respective bit lines of the memory array 102. The column circuits block 106 receives a group of N column address signals, various control signals 112, and typically may include such circuits as column decoders, array terminal receivers, read/write circuitry, and I/O multiplexers. Circuits such as the row circuits block 104 and the column circuits block 106 may be collectively termed array terminal circuits for their connection to the various terminals of the memory array 102.

Figure 2:
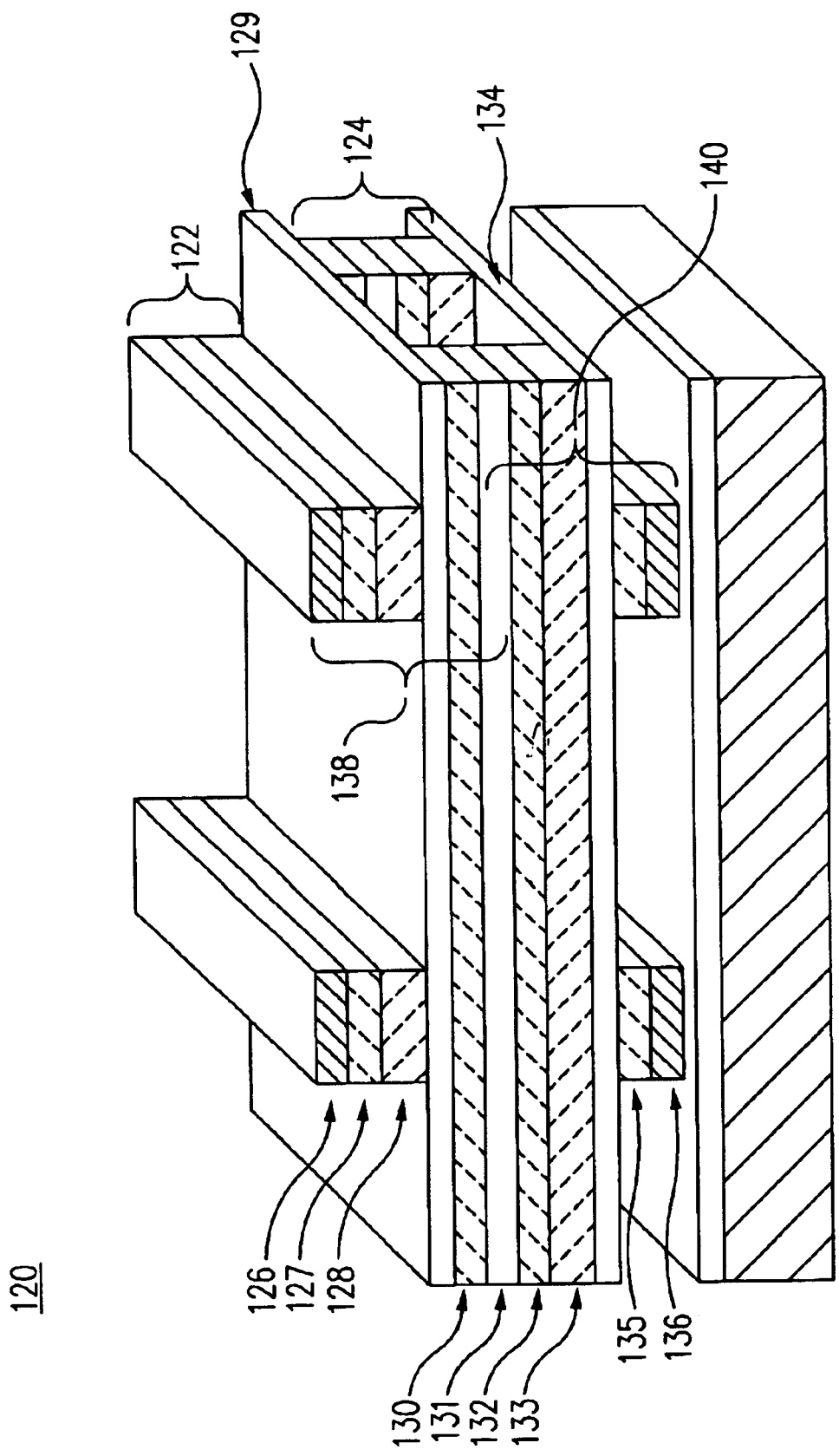
FIG. 2 is a three-dimensional view of a rail stack memory array useful for the present invention.

Referring now to FIG. 2, an exemplary memory array is depicted which utilizes rail stack structures. A rail stack may be created by successively forming (e.g., depositing) several layers of material, which are then collectively etched to form the rail stack. For example, rail stack 122 includes layers 126, 127, and 128, while rail stack 124 includes layers 130, 131, 132, and 133. In the exemplary structure shown, each memory cell is formed at the cross-over ("intersection") of two vertically-adjacent rail stacks. Memory cell 138 includes, for example, a metal layer 131, a heavily-doped p+ layer 130, an antifuse layer 129, a lightly-doped n-type layer 128, a heavily-doped n-type layer 127, and a metal layer 126. Memory cell 140 includes the metal layer 131, a heavily-doped p+ layer 132, a lightly-doped p-type layer 133, an antifuse layer 134, a heavily-doped n-type layer 135, and a metal layer 136.

Figure 3:
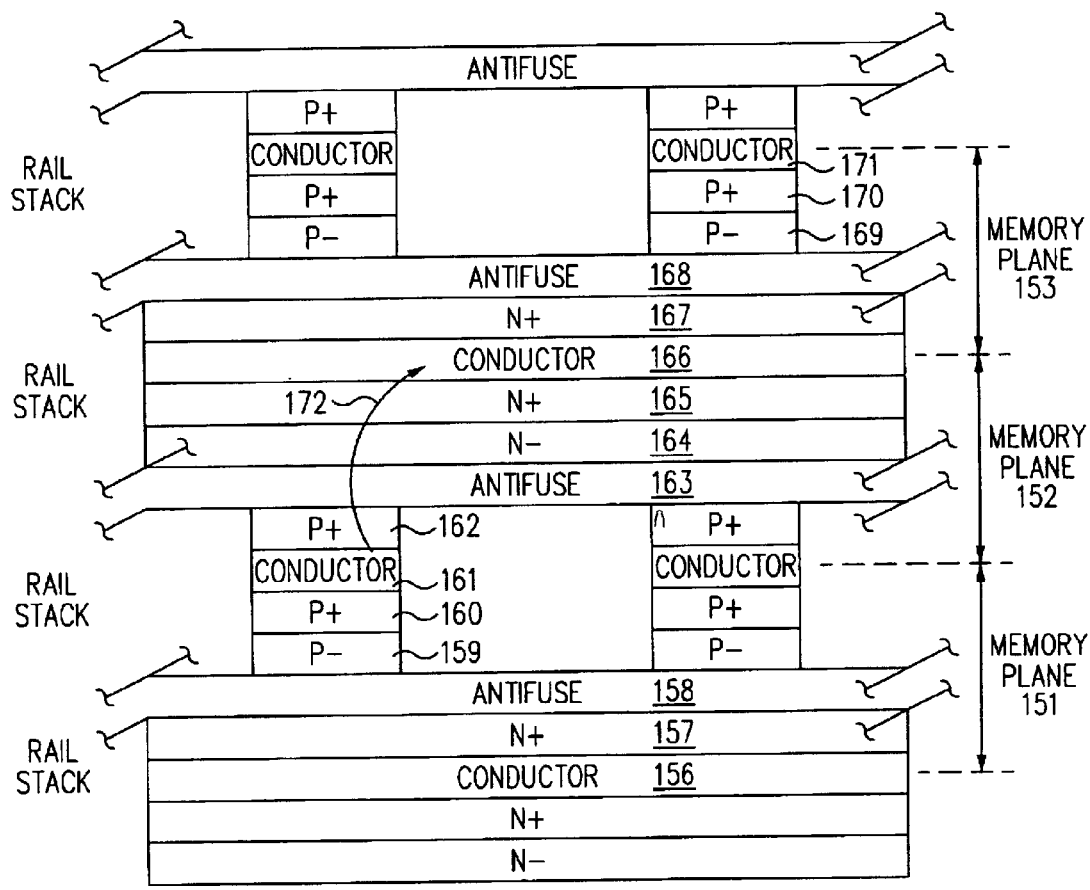
FIG. 3 is a cross-sectional view of an antifuse rail stack memory array analogous to that shown in FIG. 2.

Referring now to FIG. 3, a cross-section view is depicted which represents a structure consistent with that shown in FIG. 2. A memory plane 152 includes memory cells formed between the conductor 161 and conductor 166. A representative memory cell in this plane includes a conductor 161, a heavily-doped p-type anode region (e.g., p+ region 162) separated from a lightly-doped n-type cathode region (e.g., n− region 164) by an antifuse layer 163. The more heavily-doped n-type region (e.g., n+ region 165) is provided to ensure good ohmic contact to the n− region 164 by conductor 166. A memory cell may be programmed by applying a relatively high write voltage, 5–20V, between the conductors (e.g., between conductors 166 and 161). When a sufficient current, such as current 172, flows from anode to cathode, the antifuse layer is breached, thus allowing p+ region 162 to become electrically connected to the n− region 164 to form a conventional diode. Without this high voltage, the antifuse layer 163 remains an insulator. Thus, by selecting pairs of conductors, diodes can be selectively formed so as to program the array. The programming state of the memory element can be read by sensing current flow or voltage drop when the memory element is selected.

A representative memory cell in memory plane 153 includes a conductor 171, a p+ region 170, a p− region 169, an antifuse layer 168, an n+ region 167, and a conductor 166 (which is shared by memory plane 152). A representative memory cell in memory plane 151 includes the conductor 161 (which is shared by memory plane 152), a p+ region 160, a p− region 159, an antifuse layer 158, an n+ region 157, and a conductor 156.

It is currently preferred that the write voltage be applied with a polarity such that the more positive voltage is applied to the rail-stack that constitutes the anode of the diode that is created by the breach of the antifuse layer. It is also possible to program using a reverse-biasing potential or an alternating current (AC) signal as is well known to those of ordinary skill in the art. Additional details of such an exemplary memory array and other rail stack structures are described in U.S. Pat. No. 6,420,215, to Knall and Johnson, entitled "Three Dimensional Memory Array and Method of Fabrication", which is hereby incorporated by reference in its entirety.

Figure 4:
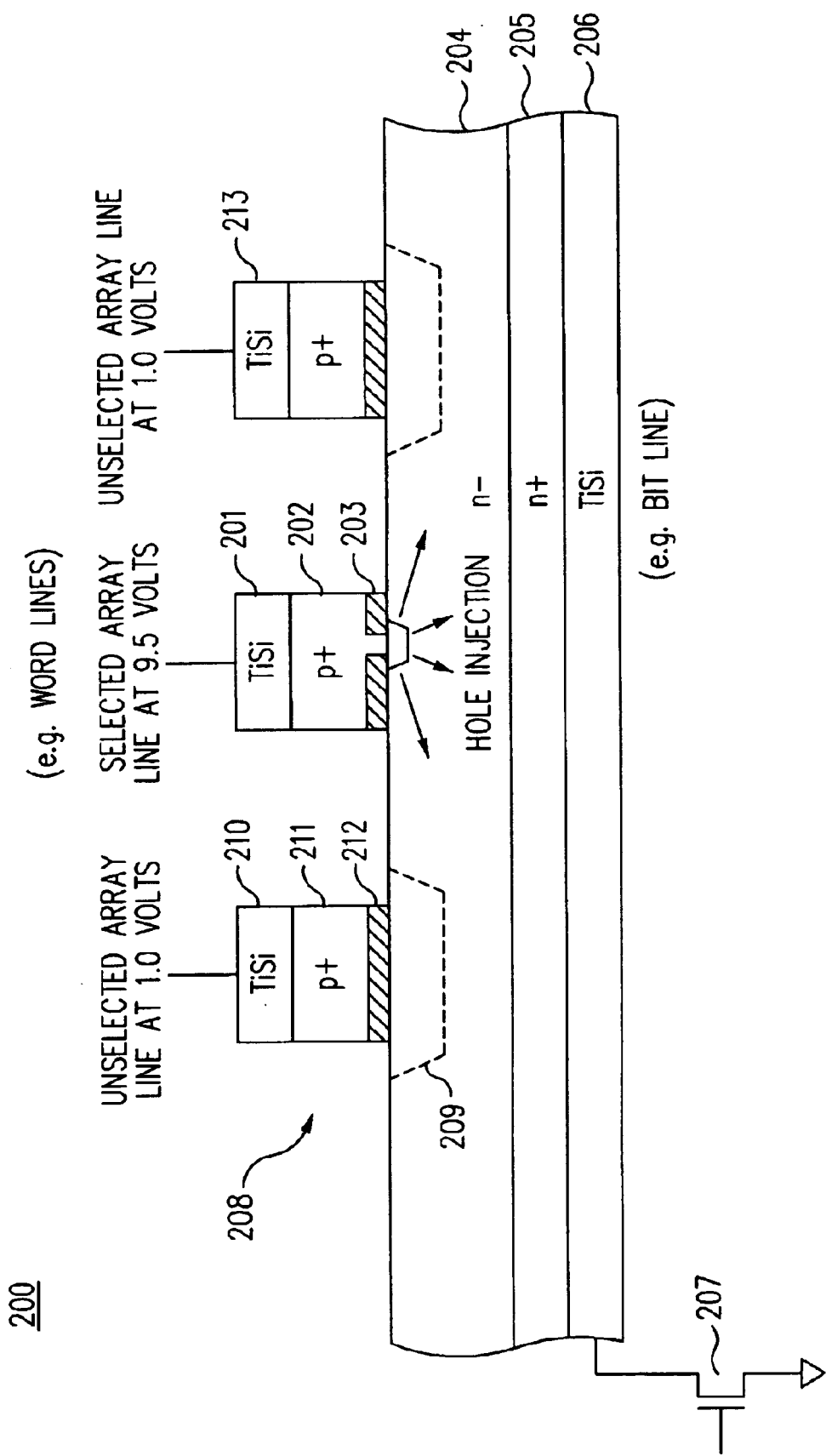
FIG. 4 is a cross-sectional view of a portion of a single memory plane of an antifuse rail stack structure, illustrating carrier injection during programming conditions.

FIG. 4 depicts a portion of a single memory plane of the rail stack structure depicted in FIG. 3, and shows three memory cells, showing exemplary biasing conditions for programming the middle memory cell. A selected array line 201 is assumed to represent a word line on a word line layer of the memory array, and may be formed of a titanium silicide (TiSi) material layer. A selected array line 206 on a vertically-adjacent array line layer is assumed to represent a bit line of the array, and may also be formed of a TiSi material layer. In the exemplary structure shown, a memory cell in a given memory plane may be programmed by driving a selected word line associated with the memory plane to a high voltage, and driving a selected bit line associated with the memory plane to ground.

The selected word line 201 is driven to a high programming voltage (e.g., $V_{PROG}$) which is shown here as 9.5 volts. The selected bit line 206 is driven to ground. The N-channel transistor 207 represents the bit line decoder/driver circuitry which grounds the selected bit line (i.e., drives the voltage of the selected bit line to ground) during a write operation. The unselected word lines 210 and 213 are biased at an unselected bias voltage for the word lines of about 1.0 volt.

As can be seen, the selected memory cell is programmed by the application of a significant forward bias voltage across the memory cell, which causes the antifuse layer 203 to breach (as shown), allowing the heavily-doped p-type anode region 202 to form a diode with the lightly-doped n-type cathode region 204. After the antifuse layer is breached, but while the programming voltages are still applied to the selected word line and bit line, the diode remains conductive. The current through the diode results from holes injected from the p+ layer 202 into the n− layer 204, which recombine and are ultimately collected by the bit line 206. In a forward biased "one-sided" diode (i.e., one of the cathode or anode much more lightly doped than the other), majority carriers from the more heavily-doped side are injected into, and flow as minority carriers through, the more lightly-doped side. In the example shown, the anode region 202 may be considered the injecting region, while the cathode region 204 may be considered the non-injecting region.

During programming, when the bit line 206 is robustly held to ground, the injected hold current generally flows vertically into the more heavily-doped cathode region 205 and into the TiSi bit line 206. The current then travels horizontally primarily along the metal line, and ultimately through device 207 to ground.

After the memory cell has been programmed, we believe that an unintended problem may occur if the selected word line remains at its high programming voltage as the selected bit line begins to transition from its programming level (e.g., ground) back to an unselected bit line voltage of, for example, 8.5 volts. As long as the selected word line remains forward biased by more than a diode drop (i.e., word line voltage greater than the bit line voltage by more than about 0.7 volts), significant hole injection continues into the n region 204.

For example, assume that the selected bit line 206 is at an intermediate voltage of 5.0 volts, while the selected word line 201 remains at a programming voltage of 9.5 volts, and the unselected word lines 210, 213 remain at 1.0 volt. Since the word line 210 is lower in voltage than the n− region 204, a depletion region 209 is formed within the n− region 204 underneath the p+ anode region 211. We theorize that the programmed memory cell p+ anode region 202 acts as a PNP emitter, the bit line rail stack n− region 204 acts as a base, and the unselected word lines act as virtual collectors. If the surface of the depleted region 209 under the virtual collectors (e.g., unselected word lines at about 1.0 volts) is converted to a p-type inversion layer by collecting injected holes, the depletion region 209 collapses and the antifuse 212 can be stressed by a large bias voltage. The magnitude of this large bias voltage is potentially as large as the differential between the instantaneous bit line voltage and the unselected word line voltage. In other words, the stress voltage on unselected unprogrammed memory cells sharing the selected bit line is only large if the bit line voltage starts rising while the selected word line remains high. Other memory cells further down the bit line may also be similarly affected. Once the first depletion region collapses, an injected hole can continue along the surface of the bit line rail (being a very lightly-doped material, and being slightly inverted to p-type by fringing fields from the unselected word lines) and can affect memory cells down the bit line in the same way.

Figure 5:
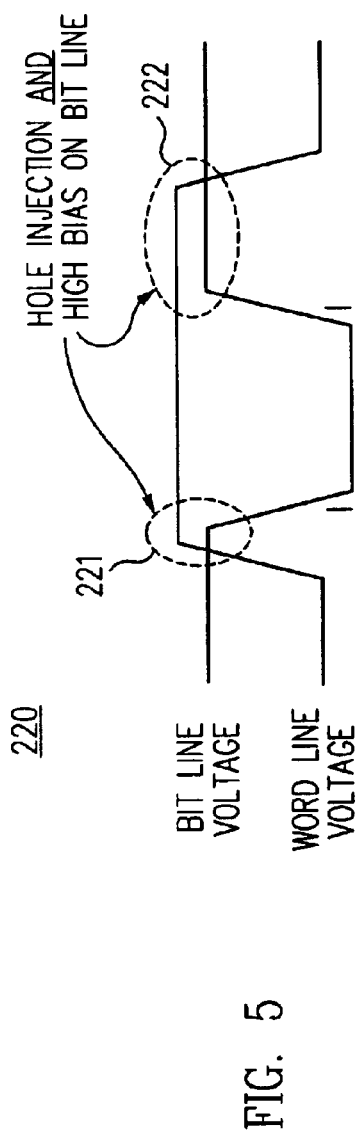
FIG. 5 is a waveform diagram of programming pulse timing likely to cause a disturbance of nearby memory cells.

FIG. 5 shows waveforms of word line and bit line programming pulses that can result in such a situation. The selected word line is shown pulsing from an unselected bias voltage of, for example, 1.0 volts to a selected bias voltage of, for example, 9.5 volts. The selected bit line is shown pulsing from an unselected bias voltage of, for example, 8.5 volts to a selected bias voltage of, for example, ground (i.e., 0 volts). The labeled region 222 corresponds to a period of time when the selected bit line is biased with a high voltage relative to the unselected word line voltage, and bias conditions which cause hole injection through the selected (and assumed programmed) memory cell. The region 221 also corresponds to a period of time when the selected bit line is biased with a high voltage relative to the unselected word line voltage, and bias conditions which may also cause hole injection through the selected if it programs very quickly, or if the cell is already programmed (e.g., such as by virtue of an earlier programming operation). Both regions 221 and 222 are believed to potentially cause erroneous programming of nearby memory cells residing on the same bit line.

Figure 6:
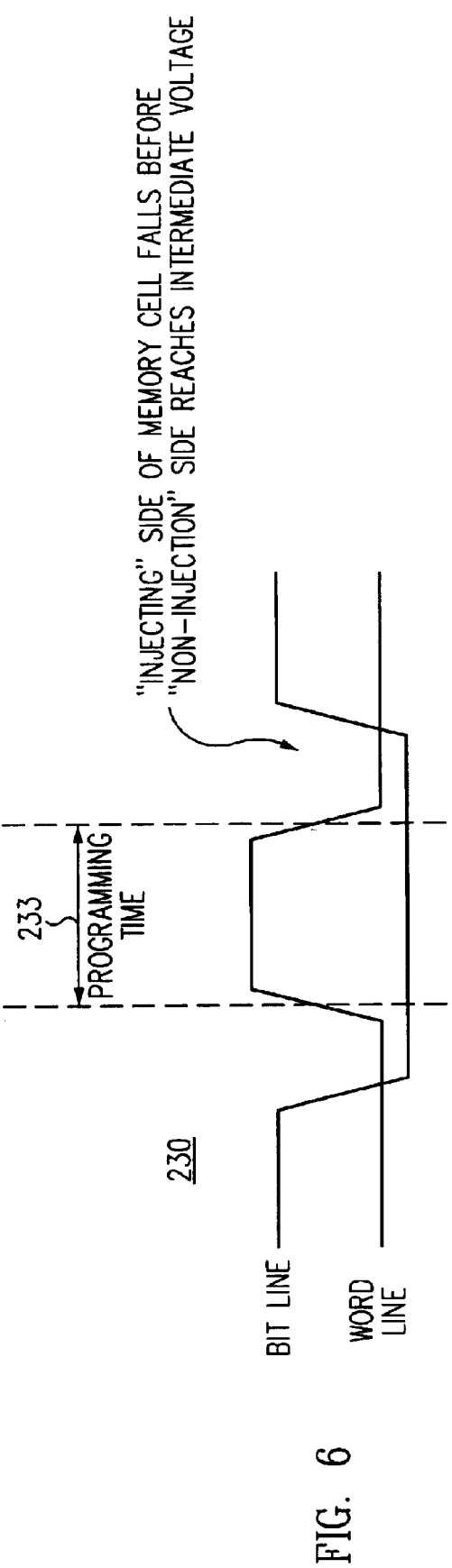
FIG. 6 is a waveform diagram of improved programming pulse timing, inc accordance with some embodiments of the present invention, which substantially reduces any disturbance of nearby memory cells.

FIG. 6 shows an improved programming pulse timing arrangement using the same bias voltages. The selected bit line initially transitions from its unselected bias level to ground. Then the selected word line transitions from its unselected bias level to its selected bias level, and returns to the unselected level after a programming pulse time 233. Finally, the selected bit line transitions back to its unselected bias level. As shown, the selected word line pulse falls entirely within the selected bit line pulse, and high bias voltages are avoided on the bit line when the selected memory cell is forward biased.

While the above example shows injection from a word line anode region into a bit line cathode region, such need not necessarily be the case. In a one sided diode, carrier injection occurs from the more heavily-doped side to the more lightly-doped side. The more heavily-doped side may represent a word line (as here) or may represent a bit line. Moreover, the more heavily-doped side may be doped p-type (i.e., forming the anode, as here) or may be doped n-type (i.e., forming the cathode). As a specific example, an antifuse memory cell may be formed using a heavily-doped p-type region associated with a bit line, and a lightly-doped n-type region associated with a word line. In such a memory cell, the injecting region is anode (here the bit line side of the diode), and the non-injecting region is the cathode (word line). In this case, to avoid the disturb condition described herein, the bit line pulse is a positive-going pulse that preferably falls within a negative-going word line pulse. Such a memory array structure is further described in "Word Line Arrangement Having Multi-Layer Word Line Segments for Three-Dimensional Memory Array," referenced above. To program several memory cells along the same word line, each of several positive-going bit line pulses may be sequentially applied, each paired with a negative-going word line pulse, or alternatively all falling within a single negative-going word line pulse.

As another specific example, an antifuse memory cell may be formed using a heavily-doped n-type region associated with a bit line, and a lightly-doped p-type region associated with a word line. In such a memory cell, the injecting region is cathode (bit line), and the non-injecting region is the anode (word line). In this case, the bit line pulse is preferably a negative-going pulse that preferably falls within a positive-going word line pulse.

Referring back to the structure depicted in FIG. 4, we believe that the following conditions are necessary to cause this disturb phenomenon to occur. The word line must be high to act as a source of high potential stress to adjacent memory cells, and the selected memory cell must be programmed or in the instant of programming. The programmed cell acts as a source of hole current injecting into the n− region of the bit line rail stack. In addition, the bit line must be pulled down enough to forward bias the p-n junction formed in the programmed memory cell, but must still be at a high enough intermediate voltage so that nearby virtual collectors can rise to a dangerous voltage level. If the bit line were at a much lower voltage, such as ground, the surface region under the virtual collectors should not rise above approximately one volt because a high electric field would pull charge away from the surface. In other words, the hole injection would be primarily vertical and flow downward into the bit line metal layer without elevating the voltage of the virtual collector regions.

It is possible that an alternate theory may explain this disturb effect. The high temperature and extremely high injection at the programming event (i.e., the 'pop' event) may cause a conductive cloud of charge to form near the programmed memory cell that is more conductive than a metal layer (e.g., titanium silicide layer) of the bit line rail stack, and the charge cloud is large enough to raise the potential of the adjacent memory cell surface regions (beneath the unselected word lines) even though the metal layer of the bit line is still held very near ground.

If either case, the modified pulse timing described above has been observed to dramatically reduce this disturb effect, compared to measurements made using the former programming pulse timing on the same integrated circuit devices. It is believed that preferable programming pulse timing eliminates or at least significantly reduces the long timing overlap after a selected memory cell is programmed (labeled 222 in the figure above). In certain embodiments preferable programming pulse timing also eliminates or at least significantly reduces the overlap at the beginning of a programming operation (labeled 221 above).

For a memory array as depicted in FIG. 4, in certain embodiments of the invention the word line voltage remains substantially at its unselected level until the bit line at least begins its transition toward its selected level. In some embodiments the word line voltage remains substantially at its unselected level until the bit line transitions at least approximately half-way toward its selected level. In yet other embodiments the word line voltage remains substantially at its unselected level until the bit line substantially reaches its selected level (e.g., transitions at least 90% toward its selected level relative to its unselected level). Similarly, at the back end of the programming pulses, in some embodiments the word line voltage substantially returns to its unselected level before the bit line begins to transition toward its unselected level. In some embodiments the word line voltage substantially returns to its unselected level before the bit line transitions at least approximately half-way toward its unselected level. In yet other embodiments the word line voltage returns to its unselected level before the bit line voltage substantially reaches its unselected level (e.g., transitions at least 90% toward its unselected level relative to its selected level).

To program multiple bits along the same word line of the memory array as depicted in FIG. 4, multiple sets of programming pulses are preferable, rather than multiple bit line pulses overlapping a long word line pulse. In addition, it may also be helpful to reduce the offset between the selected word line voltage and the unselected bit line voltage to reduce injection from previously programmed half-selected memory cells sharing the selected word line but associated with a bit line other than the selected bit line. For example, with a 9.5 volt selected word line voltage, the unselected bit line voltage is preferably increased to about 8.8 volts so that the bias across a half-selected memory cell does not substantially exceed the nominal forward diode voltage.

While any of a variety of column driver circuits may be employed, certain column driver circuits may utilize dual-use driver devices which, for combinations of decoded addresses, may drive half-selected bit lines to the unselected voltage level. If the bit line driver device is implemented as a high threshold NMOS device, the bit line may not return to a full unselected voltage, thus leaving a potentially large intermediate bias voltage on the unselected bit line. In such a case, it is particularly advantageous to drive the selected word line back to its unselected level before driving the bit line back to its unselected level as described herein. Suitable row and column circuits, including those having such dual use driver devices, are set forth in "Multi-Headed Decoder Structure Utilizing Memory Array Line Driver with Dual Purpose Driver Device," U.S. patent application Ser. No. 10/306,887, filed Nov. 27, 2002, and in "Tree Decoder Structure Particularly Well Suited to Interfacing Array Lines Having Extremely Small Layout Pitch," U.S. patent application Ser. No. 10/306,888, filed Nov. 27, 2002, which applications are hereby incorporated by reference in their entirety.

While the invention has been largely described with respect to the embodiments set forth above, the invention is not necessarily limited to these embodiments. For example, other embodiments may not include a continuous lightly-doped layer along an array line which forms the lightly-doped regions of each memory cell. In other embodiments, the lightly-doped regions of each memory cell may be separate regions, and only a more heavily-doped layer is continuous between adjacent memory cells and provide a leakage path therebetween. In yet other embodiments, the lightly-doped region may not be fully etched away by the pillar processing steps due to manufacturing variations or limitations in removing silicon in deep trench etching. Variations and modifications of the embodiments disclosed herein may be made based on the description set forth herein, without departing from the scope and spirit of the invention. Moreover, the embodiments described above are specifically contemplated to be used alone as well as in various combinations.

For example, the instant invention can also be applied to three-dimensional memory arrays configured as a plurality of levels, where word lines and/or bit lines are shared between levels, including, but not limited to: (1) the memory described in U.S. Pat. No. 6,034,882 issued on Mar. 7, 2000 and U.S. Pat. No. 6,185,122 issued on Feb. 6, 2001, to Mark G. Johnson, et al., both commonly assigned herewith; (2) the memory array described in U.S. patent application Ser. No. 09/560,626 filed on Apr. 28, 2000, in the name of N. Johan Knall and commonly assigned herewith; (3) the memory array described in U.S. patent application Ser. No. 09/814,727 filed on Mar. 21, 2001, in the name of N. Johan Knall and Mark G. Johnson and commonly assigned herewith; The memory described in "Three-Dimensional Memory Array Incorporating Serial Chain Diode Stack" by Kleveland, et al, U.S. patent application Ser. No. 09/897,705, filed on Jun. 29, 2001; the memory described in "Word Line Arrangement Having Multi-Layer Word Line Segments for Three-Dimensional Memory Array," referenced above; and the memory described in U.S. patent application Ser. No. 10/185,508 by Cleeves, filed Jun. 27, 2002, entitled "Three Dimensional Memory", each of which is hereby incorporated by reference.

Preferably, the memory cells are comprised of semiconductor materials, as described in U.S. Pat. No. 6,034,882 to Johnson et al., U.S. Pat. No. 5,835,396 to Zhang, U.S. patent application Ser. No. 09/560,626 by Knall, and U.S. patent application Ser. No. 09/638,428 by Johnson, each of which are hereby incorporated by reference. Specifically an anti-fuse memory cell is preferred. Other types of memory arrays that are stackable over support circuits, such as MRAM and organic passive element arrays, can also be used. MRAM (magnetoresistive random access memory) is based on magnetic memory elements, such as a magnetic tunnel junction (MTJ). MRAM technology is described in "A 2556 kb 3.0V 1T1MTJ Nonvolatile Magnetoresistive RAM" by Peter K. Naji et al., published in the Digest of Technical Papers of the 2001 IEEE International Solid-State Circuits Conference, ISSCC 2001/Session 7/Technology Directions: Advanced Technologies/7.6, Feb. 6, 2001 and pages 94–95, 404–405 of ISSCC 2001 Visual Supplement, both of which are hereby incorporated by reference. Certain passive element memory cells incorporate layers of organic materials including at least one layer that has a diode-like characteristic conduction and at least one organic material that changes conductivity with the application of an electric field. U.S. Pat. No. 6,055,180 to Gudensen et al. describes organic passive element arrays and is also hereby incorporated by reference. Memory cells comprising materials such as phase-change materials and amorphous solids can also be used. See U.S. Pat. No. 5,751,012 to Wolstenholme et al. and U.S. Pat. No. 4,646,266 to Ovshinsky et al., both of which are hereby incorporated by reference.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits (e.g., decoders, sensing circuits, multiplexers, input/output buffers, etc.) are not specifically described, such circuits are well known, and no particular advantage is afforded by specific variations of such circuits in the context of practicing this invention. Moreover, it is believed that one of ordinary skill in the art, equipped with the teaching of this disclosure, will be able to carry out the invention, including implementing various control circuits inferred but not specifically described herein, using well known circuit techniques and without undue experimentation. Nonetheless, additional details of bias conditions, bias circuits, and layer decoder circuits particularly suitable for a three-dimensional memory array of write-once anti-fuse passive element memory cells are described in U.S. application Ser. No. 09/897,771, entitled "Method and Apparatus for Biasing Selected and Unselected Array Lines When Writing a Memory Array", by Roy E. Scheuerlein, filed on Jun. 29, 2001, and in "Three-Dimensional Memory Array Incorporating Serial Chain Diode Stack" by Kleveland, et al, U.S. patent application Ser. No. 09/897,705, filed on Jun. 29, 2001, which are both hereby incorporated by reference in their entirety.

As used herein, a passive element memory array includes a plurality of 2-terminal memory cells, each connected between an associated X-line and an associated Y-line. Such a memory array may be a two-dimensional (planar) array or may be a three-dimensional array having more than one plane of memory cells. Each such memory cell has a non-linear conductivity in which the current in a reverse direction (i.e., from cathode to anode) is lower than the current in a forward direction. Application of a voltage from anode to cathode greater than a programming level changes the conductivity of the memory cell. The conductivity may decrease when the memory cell incorporates a fuse technology, or may increase when the memory cell incorporates an antifuse technology. A passive element memory array is not necessarily a one-time programmable (i.e., write once) memory array.

Such passive element memory cells may generally be viewed as having a current steering element directing current in a direction and another component which is capable of changing its state (e.g., a fuse, an antifuse, a capacitor, a resistive element, etc.). In certain preferred embodiments of the present invention, the memory element is a diode-like structure having a p+ region separated from an n− region by an antifuse element. When the antifuse element is programmed, the p+ region is electrically connected to the n− region and forms a diode. The programming state of the memory element can be read by sensing current flow or voltage drop when the memory element is selected. In an organic PEMA embodiment, the memory element is a diode-like structure having an anode region separated from a cathode region by an organic material layer whose conductivity changes as electrons are injected into the layer.

In the above description, an array line is generally shared by two levels of the memory array (i.e., memory planes). Alternatively, a memory array may be fabricated having two conductors for each plane that are not shared with other planes. A dielectric layer may be used to separate each such memory level.

Word lines may also be referred to as row lines or X-lines, and bit lines may also be referred to as column lines or Y-lines. The distinction between "word" lines and "bit" lines may carry certain connotations to those skilled in the art. When reading a memory array, it is assumed by some practitioners that word lines are "driven" and bit lines are "sensed." Moreover, the memory organization (e.g., data bus width, number of bits simultaneously read during an operation, etc.) may have some association with viewing one set of the two array lines more aligned with data "bits" rather than data "words." Neither connotation is necessarily intended in this description.

The directionality of X-lines (e.g., which may be shown horizontally) and Y-lines (e.g., which may be shown vertically) is merely convenient for ease of description of the two groups of crossing lines in the array. While X-lines are usually orthogonal to Y-lines, such is not necessarily implied by such terminology. Moreover, the word and bit organization of a memory array may also be easily reversed, having Y-lines organized as word lines and X-lines organized as bit lines. As an additional example, portions of an array may correspond to different output bits of given word. Such various array organizations and configurations are well known in the art, and the invention in intended to comprehend a wide variety of such variations.

The embodiments described may refer to a selected word line being driven to a voltage and a selected bit line being sensed in a read mode, and memory cell anode terminals connected to word lines and cathode terminals connected to bit lines, but other embodiments are specifically contemplated. For example, in a three-dimensional (i.e., multi-level) memory array, an adjacent memory plane may be connected similarly (e.g., a back-to-back diode stack memory array as described in U.S. Pat. No. 6,034,882 to Johnson, et al., referred to above), or may reverse the directionality of memory cells in the adjacent plane (e.g., a serial chain diode stack memory array as described in U.S. patent application Ser. No. 09/897,705 by Kleveland, et al., referred to above) so that the anode terminals are connected to bit lines and the cathode terminals to word lines. Consequently, the designations herein of X-lines, word lines, and row lines, and of Y-lines, bit lines, and column lines are illustrative of the various embodiments but should not be viewed in a restrictive sense, but rather a more general sense. For example, sensing circuits may be coupled to word lines rather than bit lines, or may be used for both word lines and bit lines, when sensing a current in a word line rather than in a bit line. For example, it should be appreciated that the designations X-line and Y-line for various array lines of a memory array on a serial chain diode stack do not necessarily imply which terminal of the memory cells (i.e., anode or cathode) is coupled to the particular line, as with a back-to-back diode stack. An X-line may be coupled to the anode terminal of memory cells in one associated memory plane, and may be coupled to the cathode terminal of memory cells in an adjacent memory plane.

Integrated circuits incorporating a memory array usually subdivide the array into a sometimes large number of smaller arrays, also sometimes known as sub-arrays. As used herein, an array is a contiguous group of memory cells having contiguous word and bit lines generally unbroken by decoders, drivers, sense amplifiers, and input/output circuits. An integrated circuit including a memory array may have one array, more than one array, or even a large number of arrays. An used herein, an integrated circuit memory array is a monolithic integrated circuit structure, rather than more than one integrated circuit device packaged together or in close proximity, or die-bonded together.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention.

What is claimed is:

1. A method for programming a memory array having at least one memory plane, said array comprising memory cells coupled between an associated one of a respective plurality of array lines on each of two memory array layers, comprising memory cells having an anode region and a cathode region, one of said cathode of anode regions being configured to inject charge to the other region when forward biased, said method comprising:

driving a first array line associated with the injecting region of a selected memory cell to a selected bias voltage for the first array line; and driving a second array line associated with the non-injecting region of the selected cell to a selected bias voltage for the first array line; then driving the first array line to an unselected bias voltage for the first array line; and driving the second array line to an unselected bias voltage for the second array line wherein the first array line voltage transitions at least a first percentage toward its unselected bias voltage before the second array line transitions at most a second percentage toward its unselected bias voltage.

2. The method of claim 1 wherein the memory array comprises a three-dimensional array having at least three array line layers defining at least two memory planes.

3. The method of claim 2 wherein the memory array comprises memory cells whose anode region is alternately an upper region of some memory layers and a lower region of vertically adjacent memory layers.

4. The method of claim 2 wherein the memory array comprises memory cells whose anode region is either an upper region of all memory layers, or a lower region of all memory layers.

5. The method of claim 1 wherein the memory array comprises antifuse memory cells.

6. The method of claim 5 wherein the memory array includes memory cells respectively comprising, at least when programmed, a diode having a first semiconductor region of a first conductivity type coupled to a respective one of a plurality of array lines on a first associated array line layer, and having a second semiconductor region of a second conductivity type coupled to a respective one of a plurality of array lines on a second associated array line layer, said second semiconductor region being more lightly doped than the first semiconductor region, said non-injecting region comprising the second semiconductor region, and said injecting region comprising the first semiconductor region.

7. The method of claim 6 wherein the second semiconductor region comprises a lightly-doped n-type (n−) semiconductor region.

8. The method of claim 6 wherein the second semiconductor region comprises a lightly-doped p-type (p−) semiconductor region.

9. The method of claim 6 wherein the second semiconductor region is initially formed as an intrinsic region.

10. The method of claim 1 wherein the memory array comprises fuse memory cells.

11. The method of claim 1 wherein the memory array comprises memory cells including a ferro-electric material.

12. The method of claim 1 wherein the memory array comprises memory cells including an organic layer.

13. The method of claim 1 wherein said non-injecting regions comprise lightly-doped semiconductor regions, and said injecting regions comprise more heavily doped semiconductor regions.

14. The method of claim 1 wherein said non-injecting regions comprise lightly-doped semiconductor regions, and said injecting regions comprise a metal.

15. The method of claim 1 wherein:
the first percentage comprises around 50%; and
the second percentage comprises around 50%.

16. The method of claim 1 wherein:
the first percentage comprises around 90%; and
the second percentage comprises around 10%.

17. The method claim 1 wherein the second array line voltage transitions at least a third percentage toward its selected bias voltage before the first array line transitions at most a fourth percentage toward its selected bias voltage.

18. The method of claim 17 wherein:
the third percentage comprises around 50%; and
the fourth percentage comprises around 50%.

19. The method of claim 17 wherein:
the third percentage comprises around 90%; and
the fourth percentage comprises around 10%.

20. The method of claim 1 wherein each array line associated with a memory cell non-injecting region comprises a continuous semiconductor layer that forms a portion of the respective non-injecting region of respective memory cells associated therewith.

21. The method of claim 1 wherein each array line associated with a memory cell non-injecting region comprises a continuous semiconductor layer that connects to the respective non-injecting region of respective memory cells associated therewith, wherein the continuous semiconductor layer and the non-injecting regions have a different doping density.

22. The method of claim 20 wherein the array comprises at least one layer of rail-stack array lines.

23. The method of claim 22 wherein the rail-stack array lines include a conductor comprising a metal.

24. An integrated circuit comprising:
a memory array having at least one memory plane, said array comprising memory cells coupled between an associated one of a respective plurality of array lines on each of two memory array layers, comprising memory cells having an anode region and a cathode region, one of said cathode or anode regions being configured to inject charge to the other region when forward biased; and array support circuitry configured, when in a programming mode, for driving a first array line associated with the injecting region of a selected memory cell to a selected bias voltage for the first array line, for driving a second array line associated with the non-injecting region of the selected cell to a selected bias voltage for the second array line, and for then driving the first array line to an unselected bias voltage for the first array line, and driving the second array line to an unselected bias voltage for the second array line, wherein the first array line voltage transitions at least a first percentage toward its unselected bias voltage before the second array line transitions at most a second percentage toward its unselected bias voltage.

25. The integrated circuit of claim 24 wherein the memory array comprises a three-dimensional array having at least three array line layers defining at least two memory planes.

26. The integrated circuit of claim 25 wherein the memory array comprises memory cells whose anode region is alternately an upper region of some memory layers and a lower region of vertically adjacent memory layers.

27. The integrated circuit of claim 25 wherein the memory array comprises memory cells whose anode region is either an upper region of all memory layers, or a lower region of all memory layers.

28. The integrated circuit of claim 24 wherein the memory array comprises antifuse memory cells.

29. The integrated circuit of claim 28 wherein the memory array includes memory cells respectively comprising, at least when programmed, a diode having a first semiconductor region of a first conductivity type coupled to a respective one of a plurality of array lines on a first associated array line layer, and having a second semiconductor region of a second conductivity type coupled to a respective one of a plurality of array lines on a second associated array line layer, said second semiconductor region being more lightly doped than the first semiconductor region, said non-injecting region comprising the second semiconductor region, and said injecting region comprising the first semiconductor region.

30. The integrated circuit of claim 29 wherein the second semiconductor region comprises a lightly-doped n-type (n−) semiconductor region.

31. The integrated circuit of claim 29 wherein the second semiconductor region comprises a lightly-doped p-type (p−) semiconductor region.

32. The integrated circuit of claim 29 wherein the second semiconductor region is initially formed as an intrinsic region.

33. The integrated circuit of claim 24 wherein the memory array comprises fuse memory cells.

34. The integrated circuit of claim 24 wherein the memory array comprises memory cells including a ferro-electric material.

35. The integrated circuit of claim 24 wherein the memory array comprises memory cells including an organic layer.

36. The integrated circuit of claim 24 wherein said non-injecting regions comprise lightly-doped semiconductor regions, and said injecting regions comprise more heavily doped semiconductor regions.

37. The integrated circuit of claim 24 wherein said non-injecting regions comprise lightly-doped semiconductor regions, and said injecting regions comprise a metal.

38. The integrated circuit of claim 24 wherein:
the first percentage comprises around 50%; and
the second percentage comprises around 50%.

39. The integrated circuit of claim 24 wherein:
the first percentage comprises around 90%; and
the second percentage comprises around 10%.

40. The integrated circuit claim 24 wherein the second array line voltage transitions at least a third percentage toward its selected bias voltage before the first array line transitions at most a fourth percentage toward its selected bias voltage.

41. The integrated circuit of claim 40 wherein:
the third percentage comprises around 50%; and
the fourth percentage comprises around 50%.

42. The integrated circuit of claim 40 wherein:
the third percentage comprises around 90%; and the fourth percentage comprises around 10%.

43. The integrated circuit of claim 24 wherein each array line associated with a memory cell non-injecting region comprises a continuous semiconductor layer that forms a portion of the respective non-injecting region of respective memory cells associated therewith.

44. The integrated circuit of claim 24 wherein each array line associated with a memory cell non-injecting region comprises a continuous semiconductor layer that connects to the respective non-injecting region of respective memory cells associated therewith, wherein the continuous semiconductor layer and the non-injecting regions have a different doping density.

45. The integrated circuit of claim 43 wherein the array comprises at least one layer of rail-stack array lines.

46. The integrated circuit of claim 45 wherein the rail-stack array lines include a conductor comprising a metal.

47. A computer readable medium encoding an integrated circuit, said encoded integrated circuit as recited in claim 24.

* * * * *

UNITED STATES PATENT AND TRADEMARK OFFICE
CERTIFICATE OF CORRECTION

PATENT NO. : 6,822,903 B2  
DATED : November 23, 2004  
INVENTOR(S) : Roy E. Scheuerlein et al.

Page 1 of 1

It is certified that error appears in the above-identified patent and that said Letters Patent is hereby corrected as shown below:

<u>Column 6,</u>  
Lines 40-41, the words "into the n region" should read -- into the n-region --.

<u>Column 12,</u>  
Line 47, the words "cathode of" should read -- cathode or --.  
Line 56, the word "first" should read -- second --.

Signed and Sealed this

Fifteenth Day of March, 2005

JON W. DUDAS  
*Director of the United States Patent and Trademark Office*